POLYCRYSTALLINE FILM HAVING CONTROLLED GRAIN SIZE
AND METHOD OF MAKING SAME
Filed Jan. 15, 1968

INVENTORS
DAVID W. BOSS
VEN Y. DOO
WILLIAM N. PATTERSON

BY Frank C. Leach Jr.
ATTORNEY

United States Patent Office 3,558,374
Patented Jan. 26, 1971

3,558,374

POLYCRYSTALLINE FILM HAVING CONTROLLED GRAIN SIZE AND METHOD OF MAKING SAME

David W. Boss, Beacon, Ven Y. Doo, Poughkeepsie, and William N. Patterson, Hopewell Junction, N.Y., assignors to International Business Machines Corporation, Armonk, N.Y., a corporation of New York Filed Jan. 15, 1968, Ser. No. 697,911
Int. Cl. H01l 7/36
U.S. Cl. 148—174 27 Claims

ABSTRACT OF THE DISCLOSURE

A film of a polycrystalline material is deposited pyrolytically on an electrically insulating surface of a substrate. By controlling the rate of deposition of the material on the substrate and the temperature of the substrate, the grain size of the polycrystalline film is regulated so that PN junctions having a sharp reverse biased breakdown may be formed therein.

Diodes or transistors have previously been formed only in monocrystalline substrates or films because the size of the grains in previously available polycrystalline materials have generally been large and non-uniform. Thus, in prior efforts to form diodes or transistors in polycrystalline material, the diffusion of an impurity of one conductivity type into a polycrystalline material of the opposite conductivity type has produced an uneven depth of penetration due to the preferred "tunnelling" diffusion effect along the grain boundaries of the polycrystalline material being large and non-uniform whereby pipes or spikes have been formed. The presence of these dopant spikes has prevented a sharp reverse biased breakdown at the junction, which has been formed in the polycrystalline material, whereby the junction has not been satisfactory.

Accordingly, only monocrystalline materials have been previously employed for the formation of diodes and transistors. While these monocrystalline materials satisfactorily permit the desired uniformity of the diffusion so that the desired sharp reverse biased breakdown at the junction is obtained, the formation of monocrystalline materials has been relatively expensive and time consuming.

The present invention satisfactorily overcomes the foregoing problem of the polycrystalline material by forming a film of polycrystalline material on an electrically insulating surface of a substrate so that the polycrystalline material has very small grains that are substantially uniform. As a result, the diffusion of impurities into the polycrystalline film will produce a relatively even penetration depth because the numerous closely spaced grain boundaries provide a uniform diffusion front whereby the PN junction in the film will have the desired attribute of a sharp reverse biased breakdown.

Accordingly, the polycrystalline film produced by the method of the present invention, especially in high speed device applications, eliminates the requirement for a monocrystalline material within which PN junctions are formed. Thus, the relatively expensive and time consuming methods of forming monocrystalline material are eliminated when using the method of the present invention.

U.S. Pat. 3,335,038 to Doo discloses the formation of a polycrystalline silicon film on a substrate of electrically insulating material as the first step in producing single crystals on the substrate. However, this method does not produce a film formed of relative uniform grains of very small size. In the Doo patent, the size of the grains in the polycrystalline material is immaterial, and there is no control of the thickness of the film and/or the temperature of the substrate.

It also has been previously suggested to form a resistor in a polycrystalline material. However, when forming this resistor on a layer of silicon dioxide, which is disposed over a silicon substrate, there is no requirement that the grains of the polycrystalline material within which the resistor is formed be relatively small and substantially uniform.

In the method of the present invention, the grain size of the polycrystalline film is controlled by regulating the temperature of the substrate on which the film has been deposited and the rate of pyrolytic deposition of the material, which forms the film, on the substrate. Through controlling both of these parameters, a polycrystalline film having substantially uniform grains of very small size can be produced. This permits substantial even diffusion of impurities into the film to form a PN junction therein.

An object of this invention is to provide a method of forming a polycrystalline film within which good quality PN junctions may be formed.

Another object of this invention is to provide a method of forming a polycrystalline silicon film with substantially uniform grains of very small size.

A further object of this invention is to provide a semiconductor device in a polycrystalline film.

A still further object of this invention is to minimize the diode recovery time by the presence of numerous uniformly distributed grain boundaries which act as the current carrier recombination centers that drastically shorten the minority carrier lifetime so as to increase the diode switching speed.

The foregoing and other objects, features, and advantages of the invention will be apparent from the following more particular description of the preferred embodiment of the invention, as illustrated in the accompanying drawing.

Figure 1:
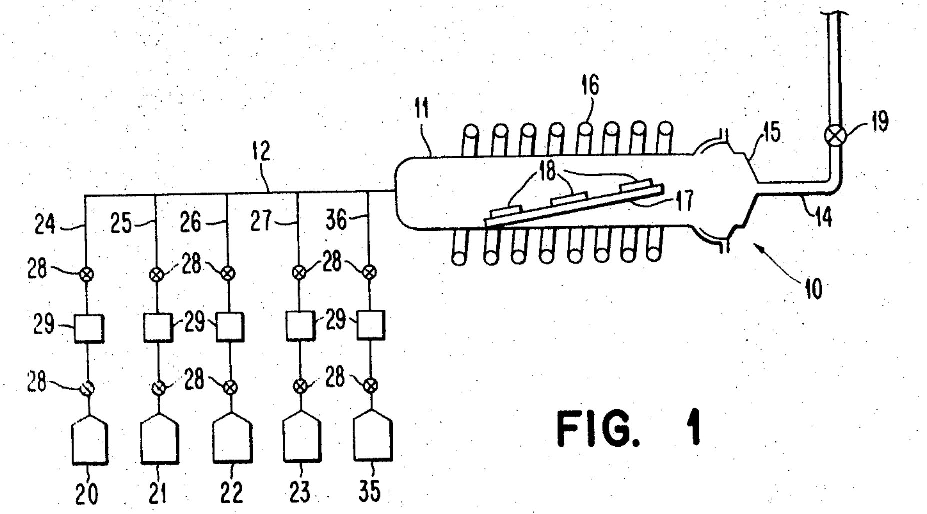
FIG. 1 is a schematic view of an apparatus for forming the polycrystalline film of the present invention on an electrically insulating surface of a substrate.

Referring to the drawing and particularly FIG. 1, there is shown an apparatus 10 by which the polycrystalline film of the present invention may be pyrolytically deposited from a vapor on an electrically insulating surface of a substrate. The apparatus 10 includes a reactor tube 11, which is preferably formed of quartz, functioning as a furnace and providing a controlled atmosphere. A selected atmosphere is supplied to the interior of the tube 11 through an inlet tube 12 and exhausted therefrom through an outlet tube 14. The outlet tube 14 is mounted in a closure member 15, which seals the open end of the tube 11.

The reactor tube 11 is surrounded by a heating element 16, which is preferably an RF coil. A susceptor block 17, which is preferably formed of graphite, is disposed within the interior of the reactor tube 11 to support a plurality of substrates 18.

The susceptor block 17 is disposed at an angle to the longitudinal axis of the reactor tube 11 to obtain a uniform deposition rate of the material being pyrolytically deposited on the substrates 18 from the vapor passing through the reactor tube 11. If the susceptor block 17 were flat, the substrates 18 would have a decreasing growth rate of the material thereon in the direction of flow of the vapor containing the material to be deposited.

The outlet tube 14 has a valve 19 therein to control flow therethrough. When the valve 19 is open, the outlet tube 14 is connected to the atmosphere.

The inlet tube 12 is connected to four different gas or vapor sources that provide the atmosphere supplied to the reactor tube 11. The sources include a cylinder 20 having pure dry high purity hydrogen, a cylinder 21 of monosilane, a cylinder 22 of oxygen, and a cylinder 23 of an impurity.

Each of the cylinders 20–23 is connected to the inlet tube 12 through tubes 24–27, respectively. Each of the tubes 24–27 contains valves 28 to regulate the flow therethrough from the cylinder to which the tube is connected.

Each of the tubes 24–27 also preferably contains a flow meter 29 to permit the rate of flow of each of the gases or vapors through its tube to be observed. Thus, by appropriately regulating the valves 28, the various desired mixtures, which form the selected atmosphere supplied to the reactor tube 11, are obtained.

Figure 2:
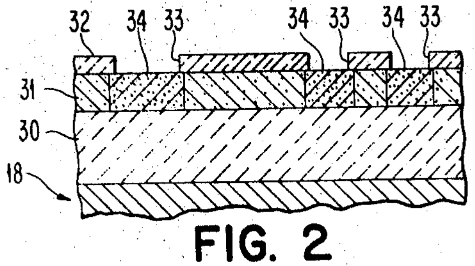
FIG. 2 is an enlarged sectional view showing the formation of PN junctions in the polycrystalline film.

As shown in FIG. 2, each of the substrates 18 is formed with an electrically insulating layer 30 thereon. For example, the substrate 18 may be formed of silicon with the layer 30 being formed of silicon dioxide ($SiO_2$), aluminum oxide ($Al_2O_3$), or silicon nitride ($Si_3N_4$). It is not necessary that the silicon of the substrate 18 be monocrystalline or have any particular polycrystalline orientation.

It should be understood that the substrate 18 could be formed of an electricaclly insulating material so that a layer of electrically insulating material would not be necessary. It is only necessary that the substrate 18 have an electrically insulating surface on which the polycrystalline film is formed and that the material of the substrate 18 be capable of withstanding the decomposition temperature of the vapor from which the material is deposited on the substrate.

Prior to positioning the substrates 18 on the susceptor block 17 in the reactor tube 11, the substrates 18 are cleaned. This cleaning may comprise a five second etch in a 7:1 [7 parts of 42% ammonium fluoride ($NH_4F$) and one part 50% hydrofluoric acid (HF)] buffered hydrofluoric acid (HF) solution. The substrates 18 are then rinsed in deionized water for five minutes. Then, the substrates 18 are dried by a hot nitrogen ($N_2$) blast.

After the substrates 18 are positioned within the reactor tube 11 on the susceptor block 17, the hydrogen gas from the cylinder 20 is directed through the reactor tube 11. This is accomplished by opening the valves 28 in the tube 24 and opening the valve 19 in the outlet tube 14. As a result, the hydrogen gas from the cylinder 20 may flow through the reactor tube 11 to purge the system. The hydrogen is supplied at the rate of approximately 14,000 cc./min. for approximately five minutes. It should be understood that the flow from each of the cylinders 20–23 is maintained at a pressure slightly greater than atmospheric to cause flow of the gas or vapor from the cylinder to atmosphere through the outlet tube 14.

Then, the heating element 16 is energized to maintain the substrate 18 at a desired temperature. When depositing silicon from monosilane vapor on the layer 30 of silicon dioxide, aluminum oxide, or silicon nitride, the temperature range of the substrate 18 is between approximately 550° C. and 1100° C. with the temperature being measured at the surface of the layer 30 on which a film 31 is grown. The preferred temperature range is 700° C. to 900° C. because it is this temperature range that gives the grain size in a lateral direction of 3000 to 5000 A.

Below 550° C., amorphous material is deposited on the layer 30, adhesion to the layer 30 is poor, and the deposition process is very slow. At temperatures above 875° C. the grain size in a lateral direction increases until it is in the range of about 5000 A.–8000 A. at 1100° C.; the grain size in the range of 5000 A.–8000 A. in the lateral direction is the maximum usable grain size.

The lower limit of the temperature range of the substrate 18 is determined by nucleation effects such as adhesion of the material, which is being pyrolytically deposited on the layer 30 from the monosilane to form the film 31, to the layer 30 and the susceptibility of the surface of the layer 30 to contamination effects. The lower limit of the temperature must be sufficient so that growth of the film 31 will occur on the surface of the insulating layer 30.

The upper limit of the temperature range of the substrates 18 is determined by the desired grain size in the lateral direction of the film 31, which is being formed on the surface of the insulating layer 30 by pyrolytic deposition. Thus, as the temperature of the substrates 18 increases, the grain size of the polycrystalline film 31 is increased. Accordingly, to form the film 31 with grains of a very small size when silicon is being pyrolytically deposited on the layer 30 of silicon dioxide or silicon nitride, the upper limit of the temperature of the substrates 18 is approximately 1100° C.

In one example of the method of the present invention in which the film 31 was deposited on the surface of the layer 30 of the substrate 18, the layer 30 was silicon dioxide with the substrate 18 being silicon. The temperature of the substrate 18 was maintained at 875° C. When maintaining the temperature at 875° C., the monosilane vapor was supplied from the cylinder 21 through the tube 25 by opening the valves 28 therein. The rate of flow of the monosilane through the reactor tube 11 is 5 cc./min. and the flow of the hydrogen through the reactor tube 11 is 14,000 cc./min. This resulted in the film 31 being grown on the surface of the layer 30 of silicon dioxide at a rate of approximately 1500 A. per minute.

After the desired thickness of the film 31 was formed on the layer 30 of each of the substrates 18, the flow of the monosilane from the cylinder 21 was stopped by closing the valves 28 in the tube 25. Through utilization of the flow meter 29 in the tube 25, the desired flow of the monosilane from the cylinder 21 is obtained to produce the desired growth rate of the film 31 on the layer 30 of each of the substrates 18.

The thickness of the film 31 in the example is .75 micron; it should be understood that the thickness of the film 31 could vary from a minimum of .1 micron to 3 microns. Likewise, while the example has disclosed the deposition rate of the silicon on the layer 30 of silicon dioxide as being .15 micron per minute, it should be understood that the maximum rate could be as high as .5 micron per minute. Of course, with this higher deposition rate, the length of time for the flow of monosilane through the reactor tube 11 would be reduced.

After the flow of monosilane from the cylinder 21 is stopped, hydrogen from the cylinder 20 continues to pass through the reactor tube 11 to purge the system. The flow rate of hydrogen is 14,000 cc./min. for five minutes. At this time, the film 31 has substantially uniform grains of very small size. The grains are formed in columns with their columnar axes perpendicular to the substrate surface. The grains have a maximum dimension in their columnar direction equal to the thickness of the film 31, which is 7500 A. in this example. It should be understood that the diameter of the column forming each grain is less than 4500 A.; this is the grain size in the lateral direction, which is perpendicular to the thickness of the film 31.

When pyrolytically depositing silicon from monosilane on the surface of the layer 30 of the substrate 18 to form the film 31, it should be understood that a suitable dopant, diborane ($B_2H_6$) for P-type conductivity and arsine ($AsH_3$) or phosphine ($PH_3$) for N-type conductivity, also is mixed with the monosilane by being supplied to the inlet tube 12 from the cylinder 23. Thus, the valves 28 in the tube 27 are opened when the valves 28 in the tube 25 are opened so as to permit both the monosilane and the dopant to be supplied simultaneously to the reactor tube 11.

If it were desired for the film 31 to have a P-type conductivity during pyrolytic deposition of silicon on the layer 30, the dopant supplied from the cylinder 23 could be diborane ($B_2H_6$) vapor, for example. If the film 31 were to have N-type conductivity, then the cylinder 23 would contain a vapor having a suitable N-type dopant. This could be phosphine ($PH_3$) or arsine ($AsH_3$) vapor. The flow rate of the impurity vapor would be determined by the desired dopant concentration of the film 31.

After the film 31 has been deposited on the surface of the insulating layer 30 of the substrate 18 with the dopant therein, it is then necessary to diffuse a dopant of the opposite type into the film 31. After purging of the system has been completed, a suitable mask is then formed on the film 31. The diffusion mask may be silicon dioxide, for example.

In order to form a layer 32 of oxidized material on the surface of the polycrystalline film 31, when it is less than 1 micron in thickness, to function as a diffusion mask, conventional oxidation methods to form silicon dioxide, for example, are not practical because of the consumption of silicon when oxidation occurs to form the layer 32. Because of the small thickness (less than 1 micron) of the film 31, the film 31 cannot afford to lose any silicon through oxidation. However, when the polycrystalline film is sufficiently thick (equal to or greater than 1 micron), normal thermal oxidation methods can be used to produce an oxide film on the top of the polycrystalline silicon film.

Accordingly, since the film 31 has a thickness of .75 micron, the oxide layer 32 is formed on the surface of the film 31 by well-known pyrolytic deposition methods. Then, the oxide layer 32 had openings or windows 33 (see FIG. 2) formed therein by suitable etching means such as the photolithographic method, for example. The substrates 18 were then returned to the reactor tube 11.

A suitable dopant of the opposite conductivity from that of the film 31 was then diffused through the openings 33 in the layer 32 to form areas 34 in the film 31 of the opposite conductivity. Thus, a PN junction was formed in the film 31 between each of the areas 34 and the film 31.

As shown in FIG. 2, the areas 34 extend through the thin film 31 because of the film's relatively small thickness. This results in the PN junction being limited to the periphery of the diffused area 34. Since the capacitance of the junction is directly proportional to the area of the junction, the junction capacitance is greatly reduced by diffusing across the entire thickness of the film 31. It should be understood that the diffusion depth could be less than the thickness of the film 31 when the film 31 is relatively thick.

In the example of the method of the present invention, the film 31 was formed with P-type conductivity by supplying diborane from the cylinder 32. Thus, the P-type impurity in the film 31 was boron.

The impurity, which was diffused through the openings 33 in the layer 32, was phosphorous. The phosphorous was diffused into the film 31 by passing phosphine vapor through the reactor tube 11 from a cylinder 35, which is connected to the inlet tube 11 by a tube 36 and maintained at a pressure slightly greater than atmospheric. The tube 36 has the valves 28 and the flow meter 29 therein the same manner as the tubes 24–27.

By maintaining the temperature of the film 31 at 1000° C., the phosphine pyrolytically decomposes in the reactor tube 11 to permit phosphorous to be diffused through the openings 33 in the oxide layer 32. The rate of flow of the phosphine depends on the desired N-type impurity concentration in the film 31.

After the areas 34 were formed in the film 31, the reactor tube 11 was then purged in the manner previously described. Then, the substrates 18 were removed from the reactor tube 11 so that the oxide layer 32 could be removed from the film 31.

Figure 3:
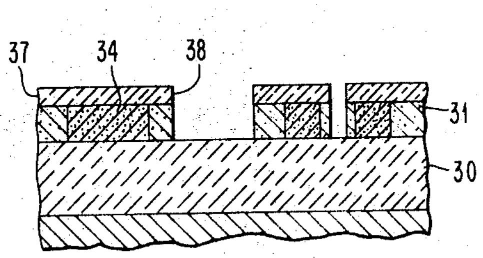
FIG. 3 is an enlarged sectional view showing a plurality of semiconductor devices in the polycrystalline film benig electrically isolated from each other.

The substrates 18 were then returned to the reactor tube 11 and another oxide layer 37 (see FIG. 3) was then grown on the surface of the film 31 by pyrolytic deposition. The layer 37 extended over the entire surface of the film 31.

The substrates 18 were removed from the reactor tube 11 after purging of the reactor tube 11 in the manner previously described. Openings 38 were then etched in the layer 37 by suitable means such as the photolithographic method, for example. Then, the film 31 was removed from the areas in which the film 31 did not contain a PN junction by a timed etch with suitable etchants.

Accordingly, the polycrystalline film 31 comprises a plurality of separate islands with each of the islands having a PN junction formed therein. Because of the insulating layer 30, the islands are electrically insulated from each other.

Figure 4:
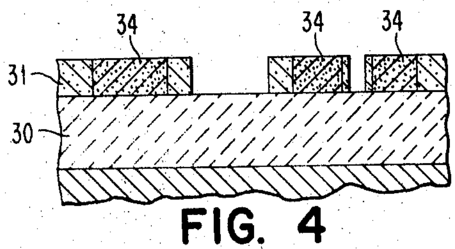
FIG. 4 is an enlarged sectional view showing a plurality of semiconductor devices in the polycrystalline film formed on an electrically insulating surface of a substrate.

After the film 31 was separated into the islands, the layer 37 was removed from the film 31; the final finished product is shown in FIG. 4 wherein the film 31 comprises separate islands with each having a PN junction therein. Then, suitable electrical conducting means could be connected to the opposite areas of conductivity.

It should be understood that each of the islands could have more than one PN junction therein if desired. In such an arrangement, the etching of the film 31 would be accomplished so that more than one PN junction in the film 31 would be within the electrically insulated island.

The following examples are included to show methods that produced polycrystalline diodes electrically insulated from each other through utilizing the film formed by the present invention. These examples are not intended to place limitations on the scope of the invention not expressed in the claims.

EXAMPLE I

A silicon wafer substrate was first cleaned in acetone, then in nitric acid ($HNO_3$), and finally in hydrofluoric acid (HF) with a thorough deionized water rinse after each cleaning agent. The water substrate was then oxidized in an $H_2O$ vapor atmosphere at 1150° C. for fifteen minutes. This resulted in a silicon dioxide layer of 4000 A. thickness.

The deposition of the polysilicon on the surface of the silicon dioxide layer was made in a quartz chamber tube, which had a diameter of 50 mm. and a length of 80 cm. The substrate was supported on a quartz encased carbon RF susceptor within the tube. Prior to deposition the chamber tube had the substrate disposed therein on the susceptor. The chamber tube was then evacuated to a pressure of less than 1 micron of Hg. The chamber tube was then flushed for five minutes by hydrogen at a flow rate of 20 liters/min.

The deposition temperature of 875° C. was then reached and stabilized within three minutes. The deposition of the silicon started immediately after the deposition temperature of 875° C. was reached.

A P-conductivity polycrystalline silicon film of .5 micron thickness with a resistivity of .1 ohm-cm. was then deposited on the surface of the silicon dioxide layer of the substrate under the following conditions. To deposit the film, the chamber tube had a flow therethrough of 7 liters/min. of hydrogen, 5 cc./min. of monosilane ($SiH_4$), and 5 cc./min. of 266 parts per million of diborane ($B_2H_8$) in hydrogen. With the deposition temperature being held at 875° C., this flow rate through the chamber tube was continued for three minutes. The film had a grain size in the lateral direction in the range of .3 micron to .5 micron.

A masking oxide of 3200 A. thickness was then pyrolytically deposited on the film in four minutes. This prolytic deposition was made at 800° C. with a flow through the chamber tube of 30 liters/min. of hydrogen, 300 cc./min. of oxygen, and 155 cc./min. of hydrogen through a bubbler containing tetrachlorosilane ($SiCl_4$) at 23° C. Oxides of this type have an etch rate of 60 A. per second in a buffered (7:1 of 42% $NH_4F$:50% HF) HF etch.

The areas of the surface of the polysilicon film into which the dopant of opposite impurity was to be diffused were then stripped by Kodak's Photoresist techniques of the silicon dioxide layer, which had been pyrolytically deposited on the film. Diffusion of the dopant of N-type impurity into the P-type polysilicon film was then made at 1000° C. for thirty minutes with hydrogen being the carrier gas at a flow rate of 7 liters/min. through the chamber tube. The flow rate of the N-type impurity was 7 cc./min. of 196 parts per million of phosphine ($PH_3$) in hydrogen.

These conditions produced a diffusion with a $C_0$ of approximately $5\times10^{19}$ atoms/cc. and a junction depth of approximately 2.5 microns. Since the thickness of the polysilicon film was only .5 micron, the diffusion extended to the underlying thermal oxide. This produced a small area PN junction that is substantially perpendicular to the underlying oxide.

The isolation of the diodes, which were formed on the substrate as the various PN junctions under the foregoing conditions, was accomplished by first pyrolytically oxidizing over both the diffused areas and the pyrolytic oxide, which formed the mask for the diffusion of phosphine into the P-type polysilicon film. Then, photoresist masking and buffered HF etching were utilized to produce isolated islands of the diffusion mask pyrolytic oxide and the previously mentioned pyrolytic oxide with each of these islands having a surface area larger than the surface area of the diffused area, which the island overlaid.

Then, the polysilicon film was etched to form its size to substantially that of the island of the previously etched diffusion mask pyrolytic oxide and pyrolytic oxide for isolating the diodes. This silicon etching was accomplished by an etching consisting of one part hydrofluoric acid (HF), two parts acetic acid, and fifteen parts nitric acid ($HNO_3$). This resulted in electrically isolated islands including one of the diffused areas, a surrounding portion of the film, and the overlying oxides.

A pyrolytic oxide was then grown to cover the edges of the polysilicon film that were exposed by the previous etching. Of course, this oxide was grown over the entire substrate on which the film had been deposited.

Then, photoresist masking and buffered HF etching were employed to provide openings in this oxide for the ohmic contacts to the surface of the diffused area, which is the area 34 in FIG. 4, and to a portion of the film 31 in the electrically isolated island in which the area 34 is formed. Thus, by making contact with the surface of the diffused area 34 and with the film 31, contacts are made to the two opposite sides of the diode in the electrically isolated island.

The ohmic contacts were made through depositing an aluminum film over the entire surface of the substrate. Photoresist masking of the aluminum film and etching of the aluminum film were then accomplished to provide the desired conductor paths for the ohmic contacts.

The diodes, which were formed in this example, have an extremely small junction area, which is limited to the side wall of the diffused area. Consequently, the capacitance of the JN junction is low since it is linearly related to the junction area, which is low. This low capacitance and the numerous recombination centers in the grain boundaries of the film provide an extremely short diode recovery time. The measured recovery time is about $2\times10^{-9}$ second. The reverse bias breakdown voltage is 7 volts.

EXAMPLE II

The same conditoins and parameters were utilized as in Example I except that the film was formed of N-type conductivity and had a dopant of P-type impurity diffused into it. Thus, in depositing the polysilicon film, 1 cc./min. of 196 parts per million of phosphine ($PH_3$) in hydrogen was passed through the chamber tube instead of a flow rate of 5 cc./min. of 266 parts per million of diborane in hydrogen. Furthermore, in the diffusion, a flow rate through the tube of 12 cc./min. of 266 parts per million of diborane ($B_2H_6$) in hydrogen was used instead of flowing 7 cc./min. of 196 parts per million phosphine in hydrogen through the tube. The same end results were obtained as described for Example I.

EXAMPLE III

The same conditions and parameters were utilized as in Example I except that the deposition temperature was 650° C. This produced a film having a grain size in the lateral direction, which is perpendicular to the thickness of the film, of less than .1 micron.

EXAMPLE IV

The same conditions and parameters were utilized as in Example II except that the deposition temperature was 650° C. This produced a film having a grain size in the lateral direction of less than .1 micron.

EXAMPLE V

The same conditions and parameters were utilized as in Example I except that the deposition temperature was 1100° C. This produced a film having a grain size in the lateral direction of approximately .8 micron. This relatively large grain size produced rather poor diodes.

EXAMPLES VI

The same conditions and parameters were utilized as in Example II except that the deposition temperature was 1100° C. As a result, the film had a grain size in the lateral direction of approximately .8 micron. This relatively large grain size produced rather poor diodes.

It should be understood that substrates other than silicon could be employed if the material of the substrate is capable of withstanding a temperature of 1000° C. In other materials, the first step of the method, which has been described in Example I, after cleaning would be a pyrolytic deposition of silicon dioxide ($SiO_2$) rather than steam oxidation.

While the method of the present invention has been described with doping the film 31 during formation thereof through supply of an impurity from the cylinder 23, it should be understood that the film 31 could be formed without any impurity therein. Then, the film 31 would be doped with the impurity after the film 31 has been formed. This would require additional masking and diffusion steps prior to forming the oxide layer 32 and diffusing the impurity through the openings 33 in the layer 32 to form the areas 34 in the film 31.

While only diodes have been shown and described as being formed by the method of the present invention, it should be understood that other semiconductor devices could be formed in the polycrystalline film 31. For example, after the areas 34 have been formed, a second junction could be formed in the areas 34 through suitable masking and diffusion operations. Thus, a transistor would be formed.

Furthermore, other types of materials could be deposited on the insulating layer 30 of the substrate 18 to form the film 31. When using materials other than silicon for forming the polycrystalline film 31, the growth rate of the film 31 must be similarly controlled so that its thickness is limited to obtain substantially uniform grains of very small size.

This is obtained through appropriately regulating the temperature range of the substrate 18 and the rate of pyrolytic deposition of the material on the surface of the layer 30 of the substrate 18. The temperature of the substrate 18 must be such that its upper limit does not permit the grain size to be so large that the grains cease to be uniform. The lower temperature limit must be higher than the decomposition temperature of the vapor from which the material is being pyrolytically deposited on the surface of the layer 30. The lower limit of the temperature range of the substrate 18 also must be such that nucleation will occur on the layer 30.

An advantage of this invention is that it eliminates the pipes or spikes in PN junctions formed in polycrystalline material. Another advantage of this invention is that it eleminates the requirement that silicon must be monocrystalline to form PN junctions therein. A further advantage of this invention is that it eleminates many critical processing steps to obtain complete isolation among devices.

While the invention has been particularly shown and described with reference to a preferred embodiment thereof, it will be understood by those skilled in the art that various changes in form and details may be made therein without departing from the spirit and scope of the invention.

What is claimed is:

1. A method of forming a film of polycrystalline material having semiconductor properties on an electrically insulating surface of a substrate comprising:
- selecting the material of the substrate so that it is capable of withstanding the decomposition temperature of the vapor from which the material is deposited on the electrically insulating surface of the substrate;
- selecting the material of the electrically insulating surface so that it does not react with the material being deposited thereon and so that it is stable at the decomposition temperature of the vapor from which the material is deposited;
- pyrolytically depositing the material on the surface of the substrate at a selected deposition rate while maintaining the substrate at a temperature within a predetermined range, determining the lower limit of the temperature range in accordance with the nucleation effects to permit the growth of the material on the surface of the substrate and the upper limit of the temperature range in accordance with the desired grain size in a lateral direction of a film to be formed by the deposited material;
- selecting the rate of deposition in conjunction with the temperature of the substrate so that the grain size of the material in the lateral direction is substantially uniform and the size of each grain in the lateral direction is less than about 8000 A.;
- and stopping the pyrolytic deposition of the material after the film is formed on the surface of the substrate with a selected thickness.

2. The method according to claim 1 in which a PN junction is formed in the film, the method including:
- depositing an impurity in the film during formation of the film;
- forming an oxide layer over the film;
- forming an opening in the oxide layer;
- and diffusing through the opening in the oxide layer an impurity into the film of an opposite conductivity from the conductivity of the impurity deposited in the film during formation of the film.

3. The method according to claim 1 in which a PN junction is formed in the film, the method including:
- diffusing an impurity into the film after formation of the film is completed;
- forming an oxide layer over the film;
- forming an opening in the oxide layer;
- and diffusing through the opening in the oxide layer an impurity into the film of an opposite conductivity from the conductivity of the impurity diffused into the film.

4. The method according to claim 1 in which the deposited material is silicon, the material is pyrolytically deposited on the surface of the substrate at a rate within the range of .05 micron per minute to .5 micron per minute, and the temperature of the substrate is in the range of 550° C. to 1100° C.

5. The method according to claim 1 in which the deposited material is silicon, the material is pyrolytically deposited on the surface of the substrate at a rate within the range of .05 micron per minute to .5 micron per minute, and the temperature of the substrate is within the range of 700° C. to 900° C.

6. The method according to claim 2 in which the impurity of opposite conductivity is diffused through the entire thickness of the film to form the PN junction only between the periphery of the diffused area and the film.

7. The method according to claim 3 in which the impurity of opposite conductivity is diffused through the entire thickness of the film to form the PN junction only between the periphery of the diffused area and the film.

8. A semiconductor comprising:
- a substrate having an electrically insulating surface;
- a film of polycrystalline material having semiconductor properties deposited on the electrically insulating surface of said substrate;
- said film being formed of substantially uniform grains of very small size with the size of each grain in a lateral direction being less than about 8000 A.;
- and said film having a PN junction formed therein.

9. The semiconductor according to claim 8 in which:
- said film comprises a plurality of separate islands;
- and each of said islands has at least one PN junction formed therein.

10. The semiconductor according to claim 9 in which:
- said film has a conductivity of one type;
- and each of said islands has a diffused area in said film of the opposite conductivity type and extending through the entire thickness of said film to form said PN junction only between the periphery of the diffused area and said film.

11. The semiconductor according to claim 9 in which each of said junctions forms a diode having the characteristics of relatively high switching speed and relatively low capacitance.

12. The method according to claim 1 in which a PN junction is formed in the film, the method including:
- forming the film of one conductivity;
- and forming one area within the film of an opposite conductivity to the conductivity of the film.

13. The method according to claim 12 including extending the one area of opposite conductivity through the entire thickness of the film to form the PN junction only between the periphery of the area of opposite conductivity and the film.

14. The method according to claim 1 in which a plurality of PN junctions is formed in the film, the method including:
- forming the film of one conductivity;
- forming a plurality of areas within the film with each of the areas having an opposite conductivity to the conductivity of the film;
- and isolating each of the PN junctions from the other PN junctions to form separate islands on the electrically insulating surface of the substrate with each island having one of the PN junctions therein.

15. The method according to claim 14 including extending each of the areas of opposite conductivity through the entire thickness of the film to form each of the PN junctions only between the periphery of each of the areas of opposite conductivity and the film.

16. The method according to claim 2 in which a plurality of PN junctions is formed in the film, the method including:
- forming a plurality of openings in the oxide layer;
- diffusing through each of the openings in the oxide layer the impurity of opposite conductivity into the film;

and isolating each of the PN junctions from the other PN junctions to form separate islands on the electrically insulating surface of the substrate with each island having one of the PN junctions therein.

17. The method according to claim 16 including extending each of the areas of opposite conductivity through the entire thickness of the film to form each of the PN junctions only between the periphery of each of the areas of opposite conductivity and the film.

18. The method according to claim 3 in which a plurality of PN junctions is formed in the film, the method including:

forming a plurality of openings in the oxide layer;

diffusing through each of the openings in the oxide layer the impurity of opposite conductivity into the film;

and isolating each of the PN junctions from the other PN junctions to form separate islands on the electrically insulating surface of the substrate with each island having one of the PN junctions therein.

19. The method according to claim 18 including extending each of the areas of opposite conductivity through the entire thickness of the film to form each of the JN junctions only between the periphery of each of the areas of opposite conductivity and the film.

20. The method according to claim 4 in which the material of the electrically insulating surface is selected from the group consisting of silicon dioxide, aluminum oxide, and silicon nitride.

21. The method according to claim 5 in which the material of the electrically insulating surface is selected from the group consisting of silicon dioxide, aluminum oxide, and silicon nitride.

22. The semiconductor according to claim 8 in which said film is polycrystalline silicon.

23. The semiconductor according to claim 9 in which said film is polycrystalline silicon.

24. The semiconductor according to claim 11 in which said film is polycrystalline silicon.

25. The semiconductor according to claim 22 in which said substrate has its electrically insulating surface formed of a material selected from the group consisting of silicon dioxide, aluminum oxide, and silicon nitride.

26. The semiconductor according to claim 23 in which said substrate has its electrically insulating surface formed of a material selected from the group consisting of silicon dioxide, aluminum oxide, and silicon nitride.

27. The semiconductor according to claim 24 in which said substrate has its electrically insulating surface formed of a material selected from the group consisting of silicon dioxide, aluminum oxide, and silicon nitride.

References Cited

UNITED STATES PATENTS

| | | | |
|---|---|---|---|
| 3,013,192 | 12/1961 | Starr | 148—174 |
| 3,240,625 | 3/1966 | Collins | 117—106 |
| 3,335,038 | 8/1967 | Doo | 148—175 |
| 3,467,557 | 9/1969 | Sterling | 148—174 |

RICHARD O. DEAN, Primary Examiner

U.S. Cl. X.R.

117—106, 200; 148—33.2, 33.3, 175, 187, 189